United States Patent
Kim

(10) Patent No.: US 11,737,243 B2
(45) Date of Patent: Aug. 22, 2023

(54) METHOD FOR PRODUCING THERMALLY CONDUCTIVE THIN FILM USING SYNTHETIC GRAPHITE POWDER

(71) Applicant: INDONG ADVANCED MATERIALS, INC., Osan-si (KR)

(72) Inventor: Dong Ha Kim, Seoul (KR)

(73) Assignee: INDONG ADVANCED MATERIALS INC., Osan-si (KR)

( * ) Notice: Subject to any disclaimer, the term of this patent is extended or adjusted under 35 U.S.C. 154(b) by 513 days.

(21) Appl. No.: 16/651,775

(22) PCT Filed: Sep. 28, 2018

(86) PCT No.: PCT/KR2018/011516
§ 371 (c)(1),
(2) Date: Mar. 27, 2020

(87) PCT Pub. No.: WO2019/066543
PCT Pub. Date: Apr. 4, 2019

(65) Prior Publication Data
US 2020/0260614 A1   Aug. 13, 2020

(30) Foreign Application Priority Data
Sep. 29, 2017  (KR) .................. 10-2017-0127267

(51) Int. Cl.
*C01B 32/225* (2017.01)
*H05K 7/20* (2006.01)
*B32B 9/00* (2006.01)

(52) U.S. Cl.
CPC ......... *H05K 7/20481* (2013.01); *B32B 9/007* (2013.01); *C01B 32/225* (2017.08)

(58) Field of Classification Search
CPC ...... C01B 32/215; C01B 32/22; C01B 32/225
See application file for complete search history.

(56) References Cited

U.S. PATENT DOCUMENTS

| | | | | |
|---|---|---|---|---|
| 7,303,005 B2 * | 12/2007 | Reis | ..................... | H05K 1/0203 257/E23.105 |
| 2013/0087446 A1 * | 4/2013 | Zhamu | .................. | C01B 32/225 977/734 |

(Continued)

FOREIGN PATENT DOCUMENTS

| CN | 102807213 A | * 12/2012 |
|---|---|---|
| JP | 2006-137860 A | 6/2006 |

(Continued)

OTHER PUBLICATIONS

English machine translation of JP2006137860A (2006).*

(Continued)

*Primary Examiner* — Richard M Rump
(74) *Attorney, Agent, or Firm* — Sughrue Mion, PLLC

(57) ABSTRACT

Disclosed is a method for producing a thermally conductive thin film for protecting elements and the like integrated inside an electronic device such as a smartphone from heat. A method for using synthetic graphite powder to produce a thin film that has excellent thermal conductivity compared to existing natural graphite thin films or metal thin films and can be produced at lower cost than existing synthetic graphite thin films obtained from polyimide or the like may be provided.

8 Claims, 17 Drawing Sheets

(56) References Cited

U.S. PATENT DOCUMENTS

2016/0141225 A1* 5/2016 Roemmler ............ F28D 20/023
 257/702
2016/0280551 A1 9/2016 Hasegawa et al.

FOREIGN PATENT DOCUMENTS

| JP | 2007-129201 A | 5/2007 |
| JP | 2013-230975 A | 11/2013 |
| JP | 2015-084431 A | 4/2015 |
| KR | 10-1509494 B1 | 4/2015 |
| KR | 10-1550445 B1 | 9/2015 |
| KR | 10-1642052 B1 | 7/2016 |
| KR | 10-1722069 B1 | 3/2017 |
| WO | 2007/087090 A2 | 8/2007 |
| WO | 2015/092871 A1 | 6/2015 |

OTHER PUBLICATIONS

English machine translation of JP2015084431 (2015).*
Whitener Jr, Keith E., and Paul E. Sheehan. "Graphene synthesis." Diamond and related materials 46 (2014): 25-34.*
Wei, Xing Hai, et al. "HClO4-graphite intercalation compound and its thermally exfoliated graphite." Materials Letters 63.18-19 (2009): 1618-1620.*
International Search Report for PCT/KR2018/011516 dated Jan. 10, 2019 [PCT/ISA/210Sp.

* cited by examiner

[Fig. 1]
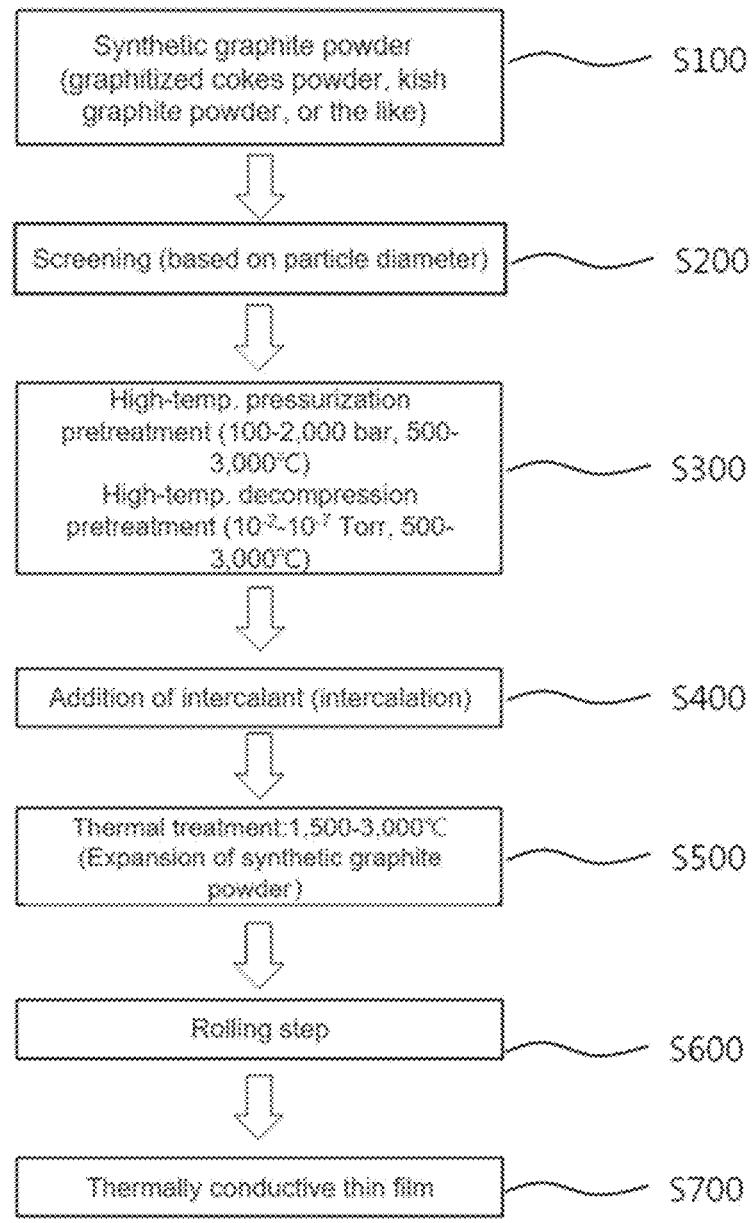

[Fig. 2]
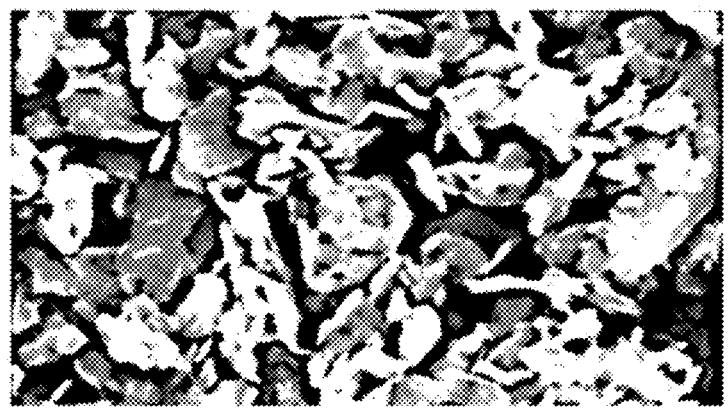
[Fig. 3]
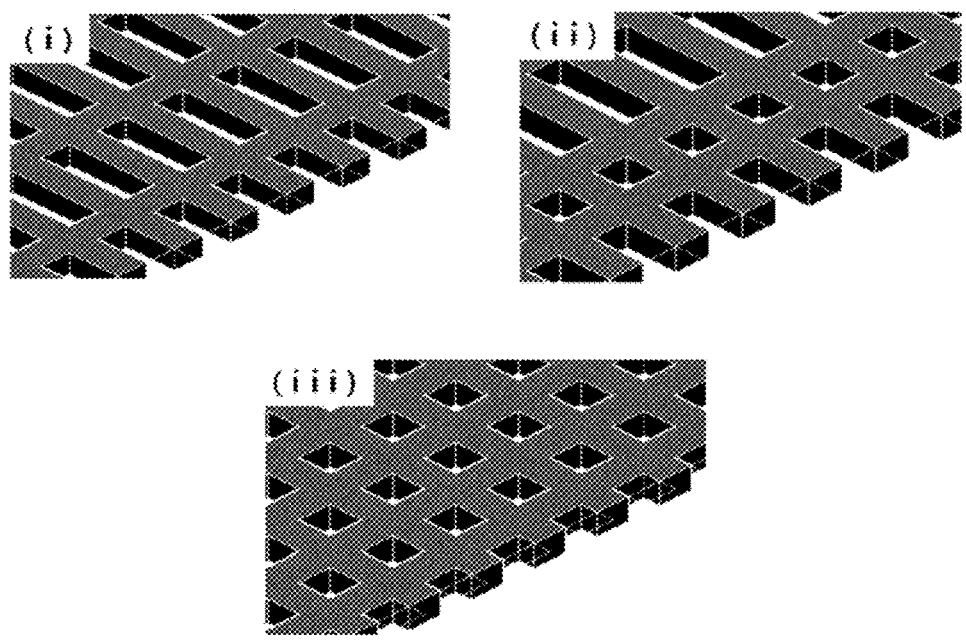

[Fig. 4]
[Fig. 5]
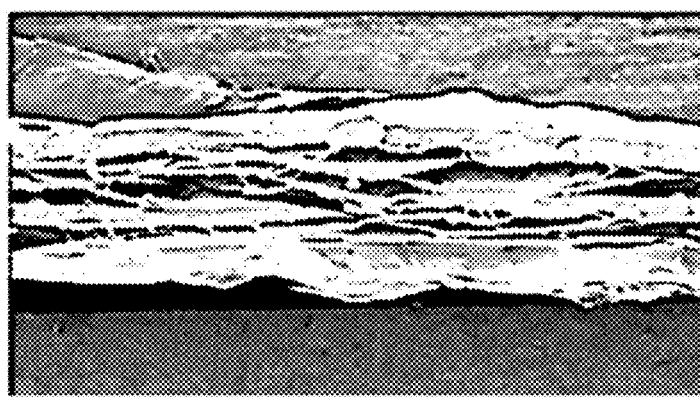

[Fig. 7a]
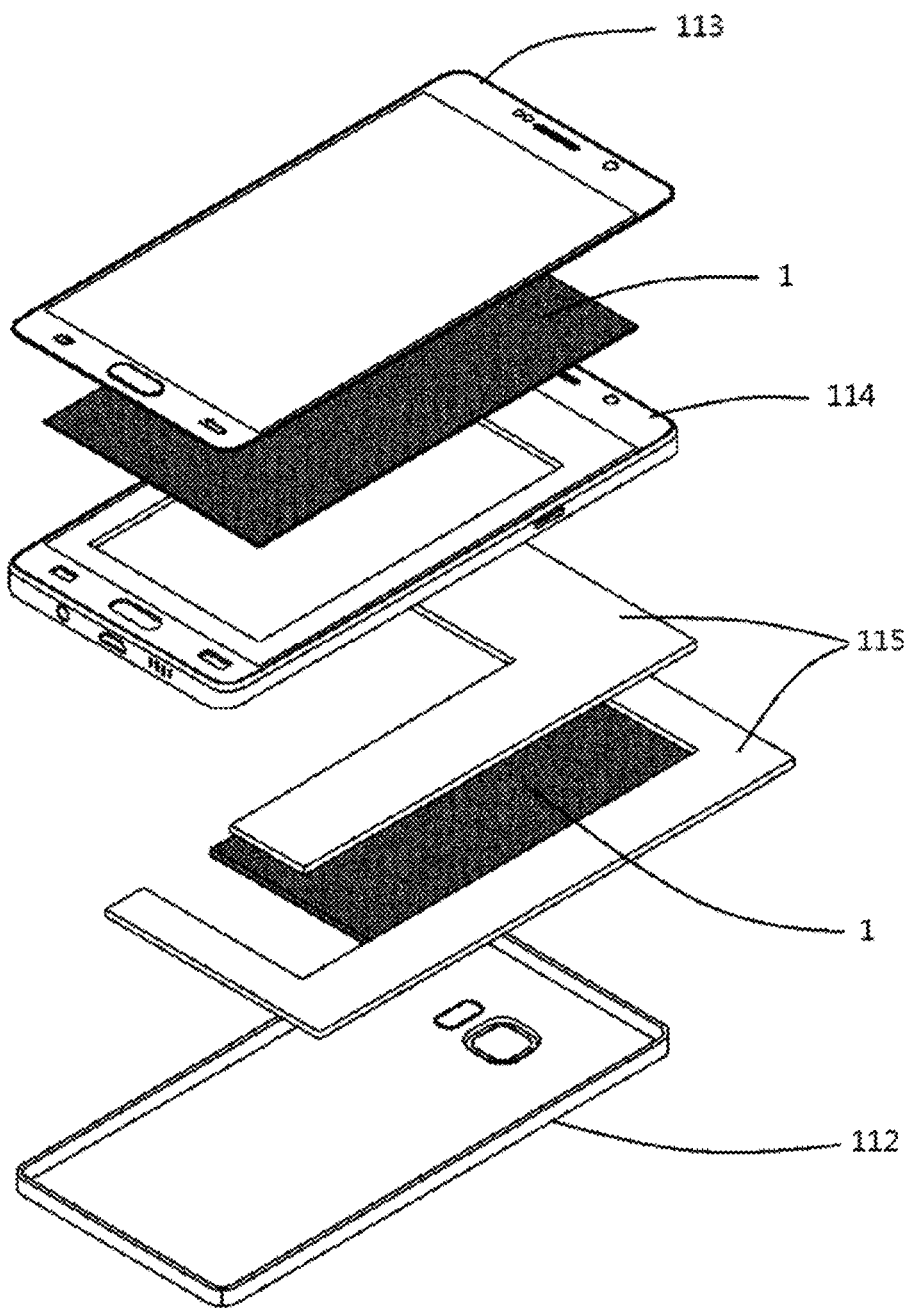

[Fig. 7b]
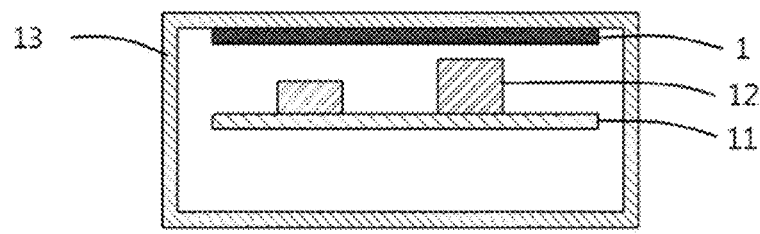
[Fig. 7c]
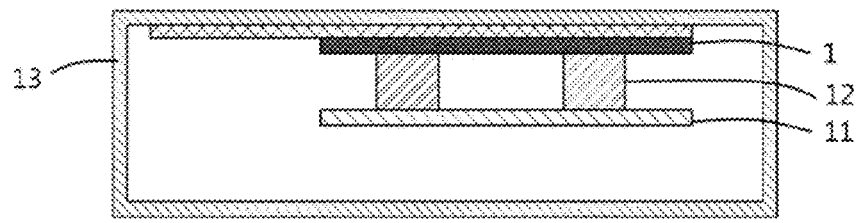
[Fig. 7d]
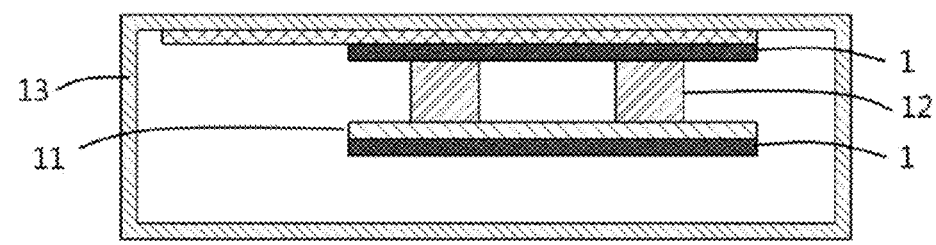

[Fig. 8a]
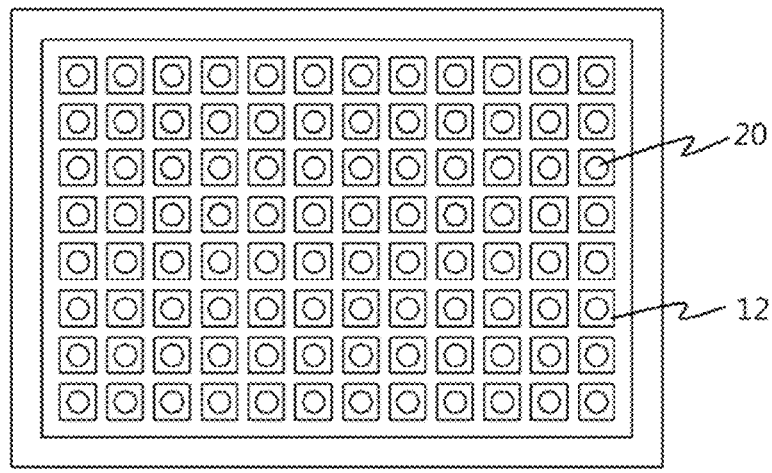
[Fig. 8b]
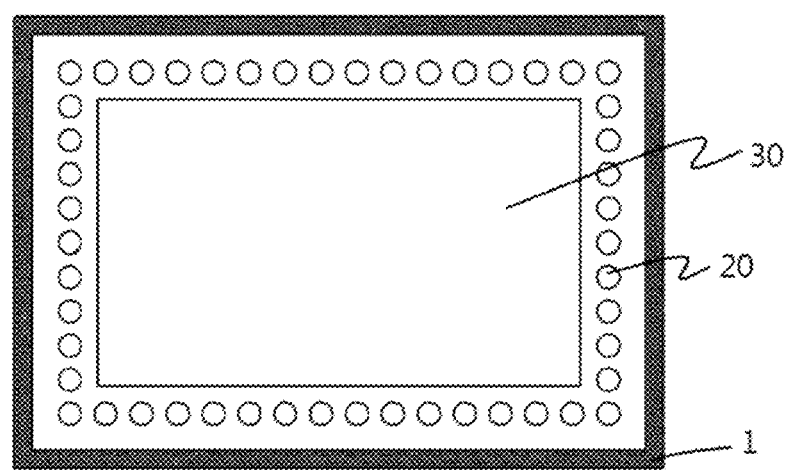

[Fig. 9a]
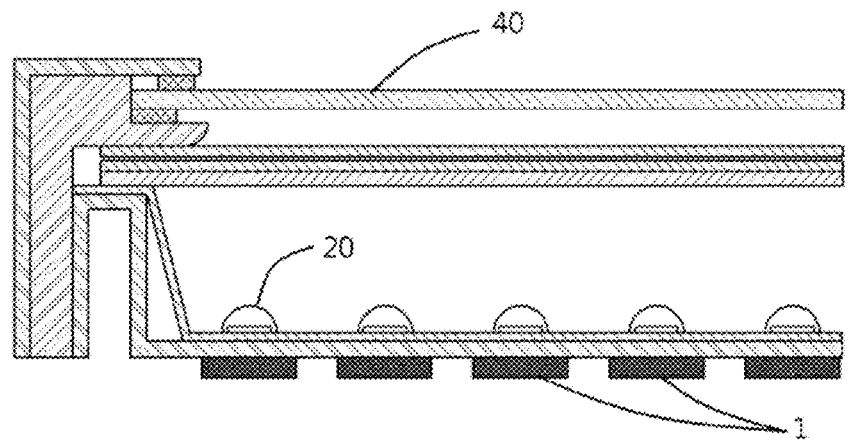
[Fig. 9b]
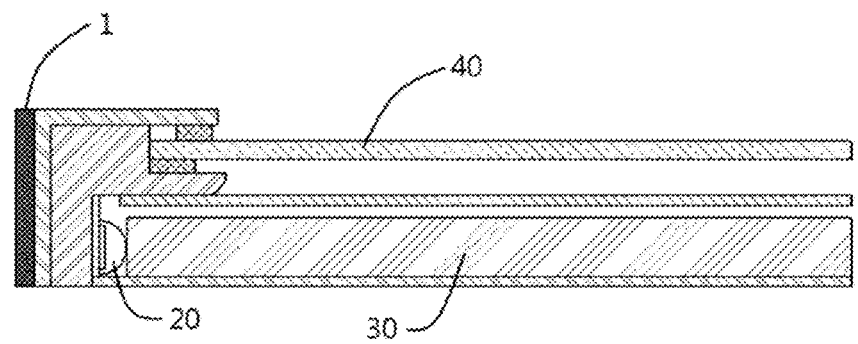

[Fig. 10]
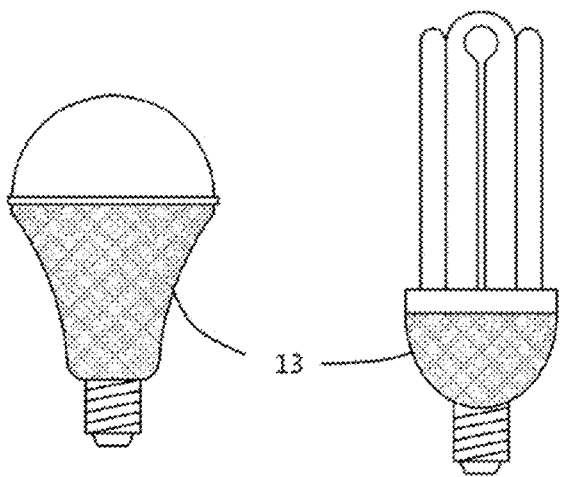
[Fig. 11]
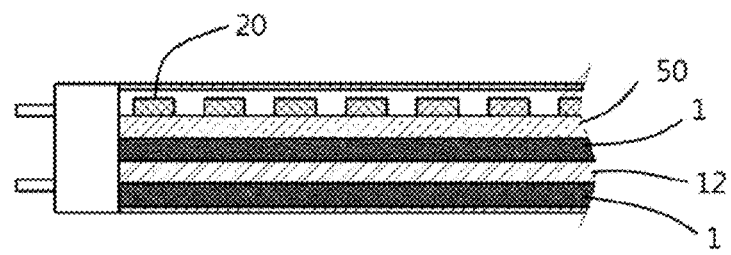

[Fig. 12]
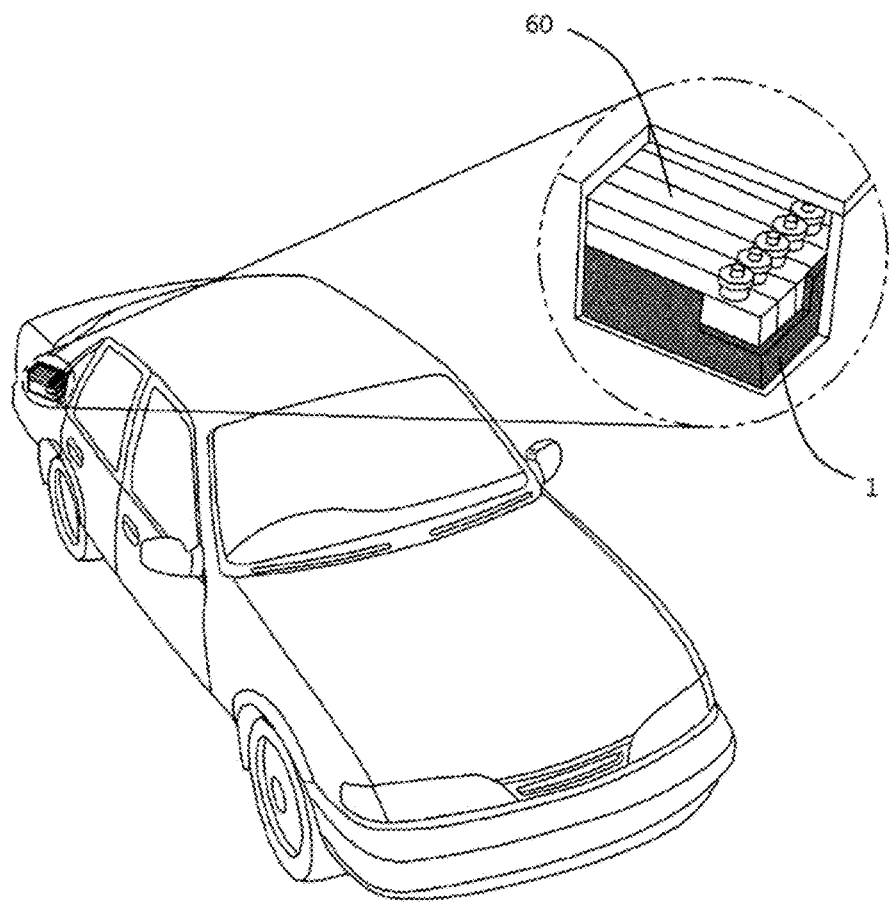

[Fig. 13a]
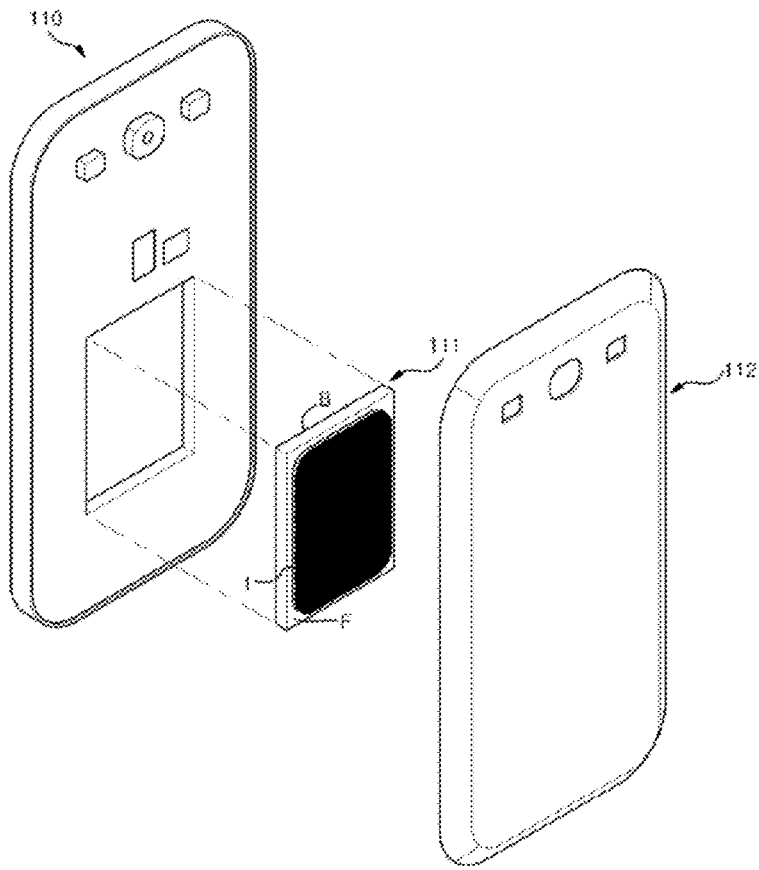
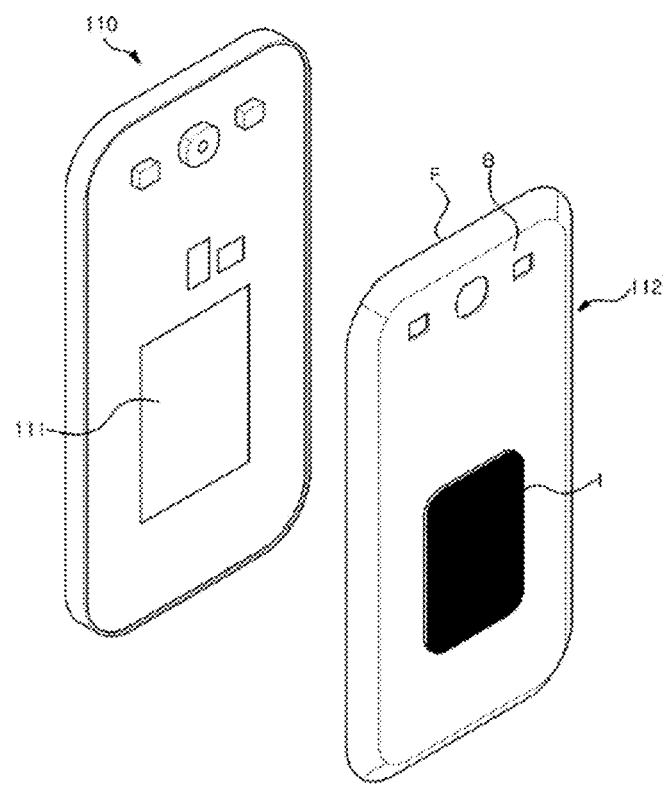

[Fig. 13b]
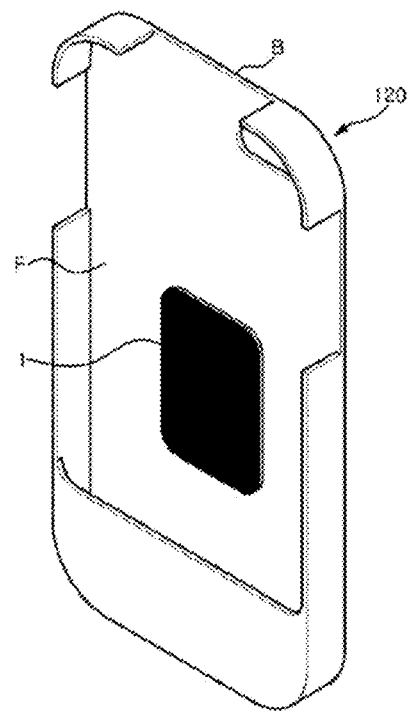
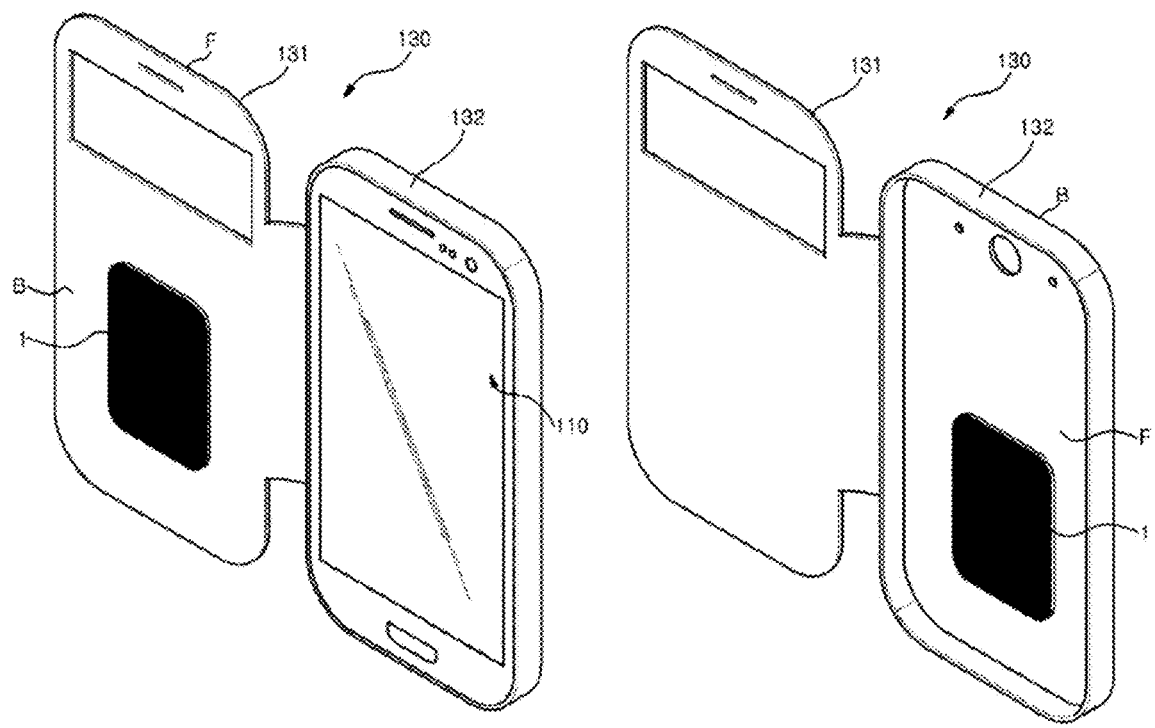

[Fig. 14a]
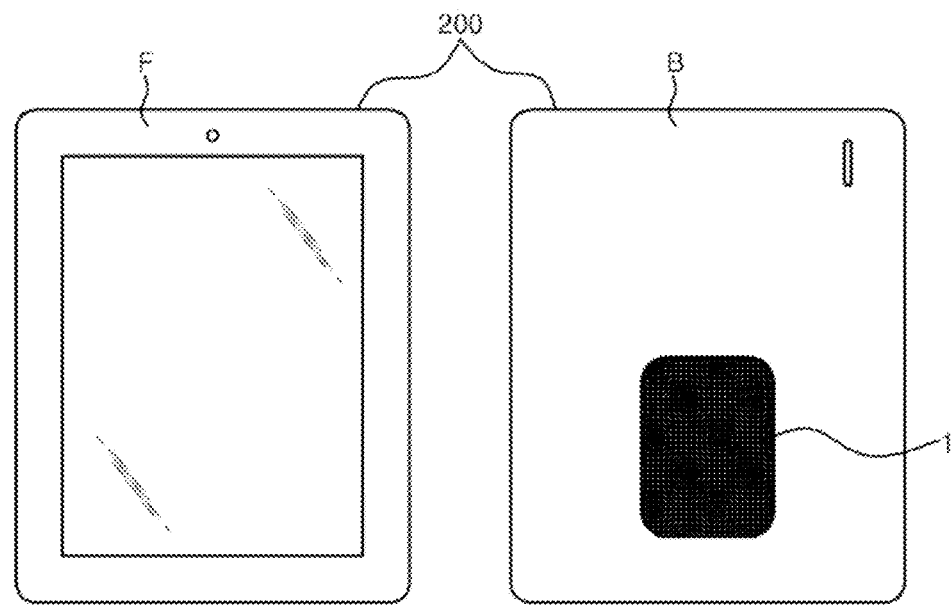
[Fig. 14b]
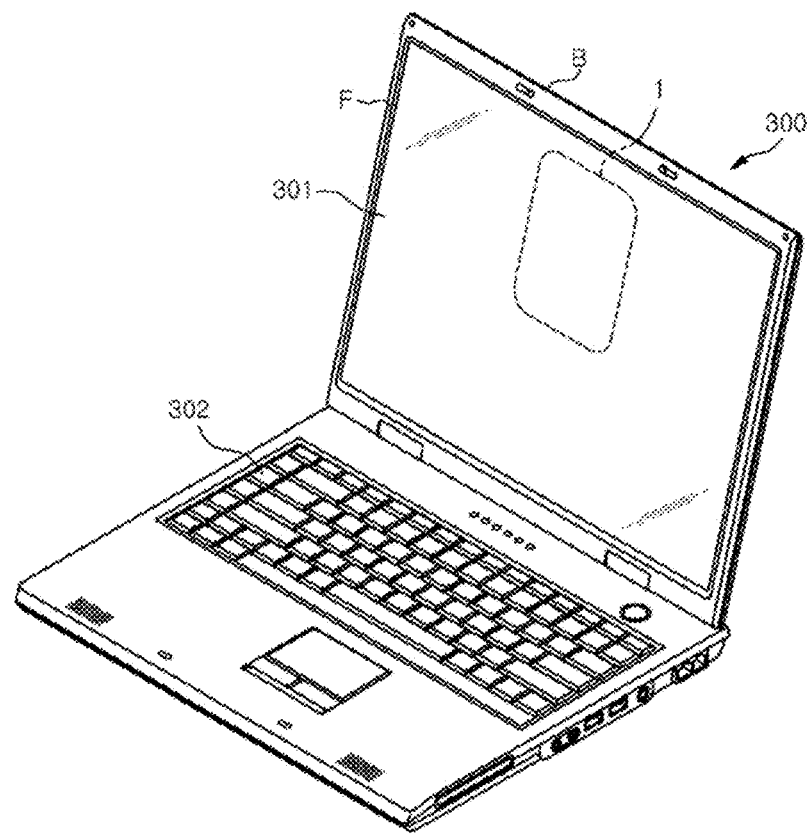

[Fig. 14c]
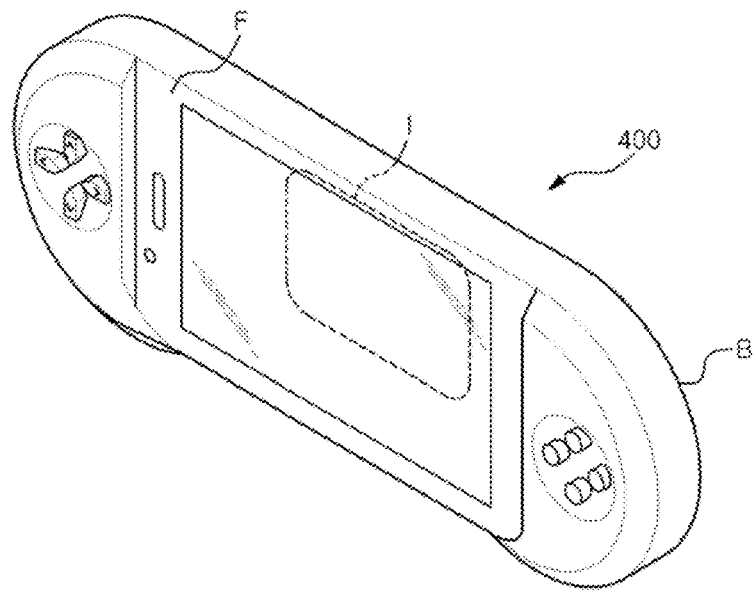
[Fig. 14d]
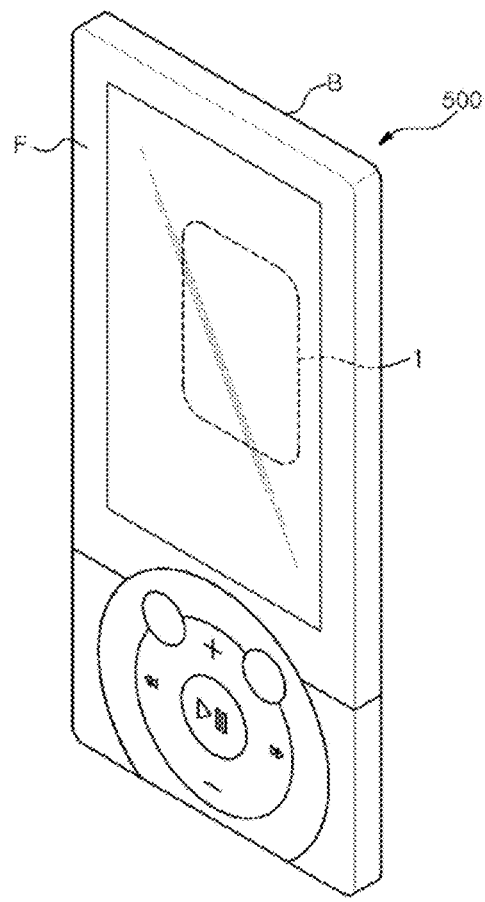

[Fig. 15a]
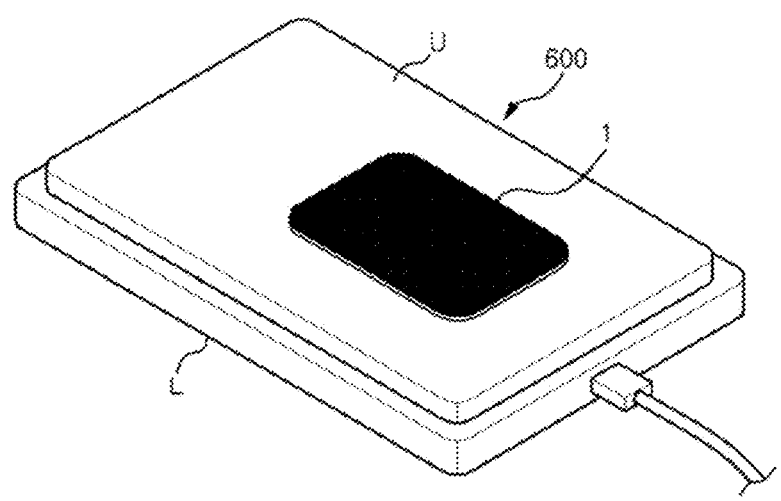
[Fig. 15b]
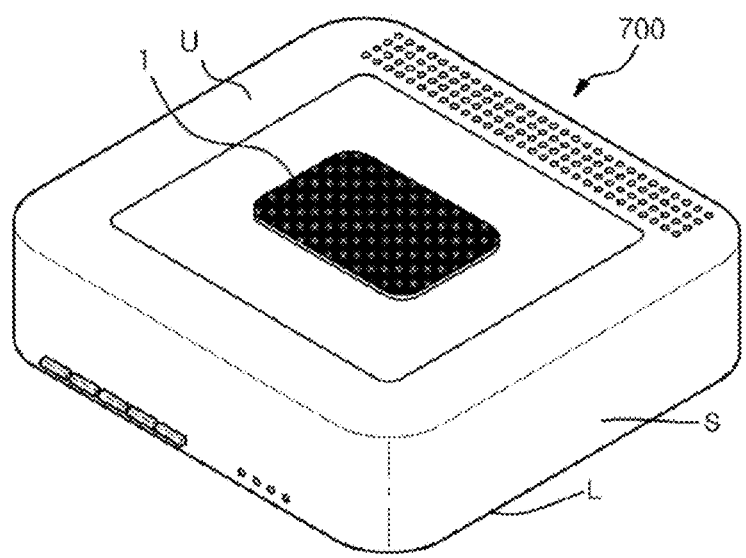

[Fig. 15c]
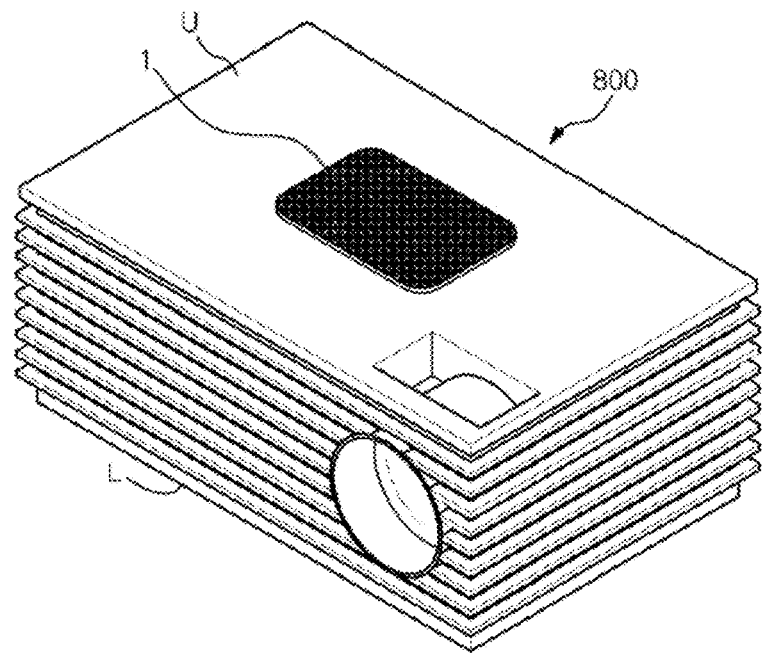
[Fig. 15d]
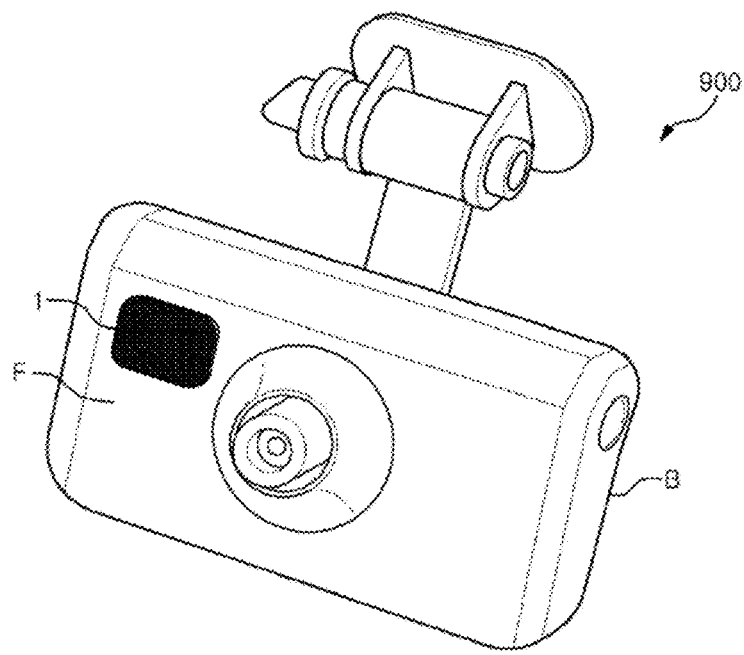

[Fig. 15e]
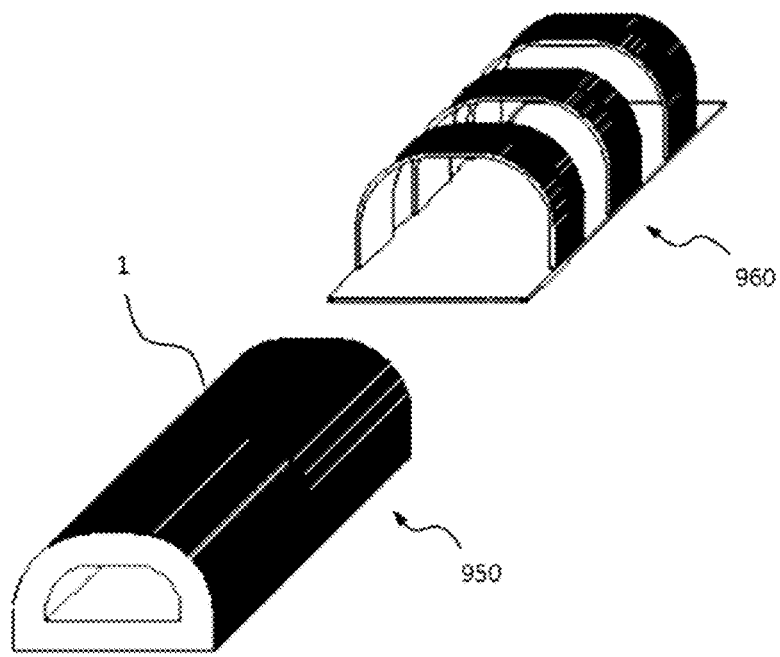

METHOD FOR PRODUCING THERMALLY CONDUCTIVE THIN FILM USING SYNTHETIC GRAPHITE POWDER

CROSS REFERENCE TO RELATED APPLICATIONS

This application is a National Stage of International Application No. PCT/KR2018/011516 filed Sep. 28, 2018, claiming priority based on Korean Patent Application No. 10-2017-0127267 filed Sep. 29, 2017.

TECHNICAL FIELD

The present invention relates to a process for preparing a thermally conductive thin film for protecting elements integrated into an electronic device such as smartphones from heat. More specifically, the present invention relates to a process for preparing a thermally conductive thin film that is excellent in thermal conductivity and formation to a thin film from raw graphite powder.

BACKGROUND ART

In recent years, as electronic devices have been highly integrated and thinner at a rapid pace, the performance of chips mounted in such devices has been reinforced. This trend is spreading to not only electric/electronic devices but also automobiles, medical devices, and so on. As the chips used in electronic devices are highly integrated, heat is more generated, thereby causing many problems such as deterioration in the performance of the electronic devices, malfunction of their peripheral devices, thermal degradation of their substrates, and the like. In particular, a thinner heat-dissipating material is required for a lighting device or an electronic device that employs an LED, an OLED, or the like. In this regard, a substrate on which IC chips are mounted is made of a metal printed circuit board (PCB) having good thermal conductivity, or a heat sink made of aluminum is used, to thereby control heat. In addition, a thermally conductive thin film such as a natural graphite thin film and a synthetic graphite thin film that employs a carbon-based material, a copper foil, and the like are mainly used for controlling heat in electronic devices (see Korean Patent No. 1509494).

Among these, a natural graphite thin film is generally prepared by expanding the intermolecular space bonded by weak van der Waals forces through acid and thermal treatment, followed by pressing thereof. The thickness thereof is relatively thick. If a thin film is prepared in this method, there would be a problem that the tensile strength is low, thereby rendering it difficult to handle, and the thermal conductivity is not so high.

In addition, a synthetic graphite thin film is superior in thermal conductivity to a natural graphite thin film. However, since a synthetic graphite thin film is prepared by calcining an expensive polymer film (e.g., a polyimide film) at high temperatures of 2,000 to 3,000° C., it involves high costs in terms of raw materials and equipment, resulting in an increase in the price of final products, and it is very difficult to prepare a thin film in the form of a roll having a wide width (e.g., 1,000 mm).

In addition, copper foil has an intermediate level of thermal conductivity and tensile strength between a natural graphite thin film and a synthetic graphite thin film. Copper foil, however, is disadvantageous in that the preparation of a thin copper foil involves high costs and that it is inconvenient to handle copper foil because it is hardly restored once crumpled.

DISCLOSURE OF INVENTION

Technical Problem

Accordingly, an object of the present invention is to provide a process for preparing a thermally conductive thin film having excellent thermal conductivity as compared with a conventional natural graphite thin film or a metal thin film at a less cost than a conventional synthetic graphite thin film prepared from polyimide or the like by way of using synthetic graphite powder.

Another object of the present invention is to provide a thermally conductive thin film prepared by the above process.

Still another object of the present invention is to provide an article provided with the thermally conductive thin film therein.

Solution to Problem

In accordance with the object, the present invention provides a process for preparing a thermally conductive thin film, which comprises: (1) pretreating synthetic graphite powder under a pressurized or decompressed condition; (2) adding an intercalant to the pretreated synthetic graphite powder; (3) thermally treating the synthetic graphite powder to which the intercalant has been added; and (4) rolling the thermally treated synthetic graphite powder.

In accordance with another object, the present invention provides a thermally conductive thin film prepared by the above process.

In accordance with still another object, the present invention provides an article provided with the thermally conductive thin film therein, which is an electronic device, an electronic device case, a lighting device, a battery, a battery case, or an EMI gasket.

Advantageous Effects of Invention

According to the present invention, it is possible to provide a process for preparing a thermally conductive thin film having excellent thermal conductivity as compared with a conventional natural graphite thin film or a metal thin film at a less cost than a conventional synthetic graphite thin film prepared from polyimide or the like by way of using synthetic graphite powder.

The thermally conductive thin film prepared in the present invention may dissipate heat generated in electronic devices such as smartphones and tablet PCs and lighting devices into which IC chips are highly integrated.

BRIEF DESCRIPTION OF DRAWINGS

FIG. 1 illustrates an example of the process for preparing a thermally conductive thin film according to the present invention.

FIG. 2 is a scanning electron microscope (SEM) image of synthetic graphite powder before expansion.

FIG. 3 shows various examples of meshes for screening synthetic graphite powder.

FIG. 4 is an SEM image of a cross-section of a thermally conductive thin film prepared according to the example.

FIG. 5 is an SEM image of a cross-section of a thin film prepared without carrying out pretreatment under a decompressed condition.

FIGS. 7a to 15e illustrate examples in which the thermally conductive thin film of the present invention is employed in various articles.

REFERENCE NUMERALS OF THE DRAWINGS

Figure 6:
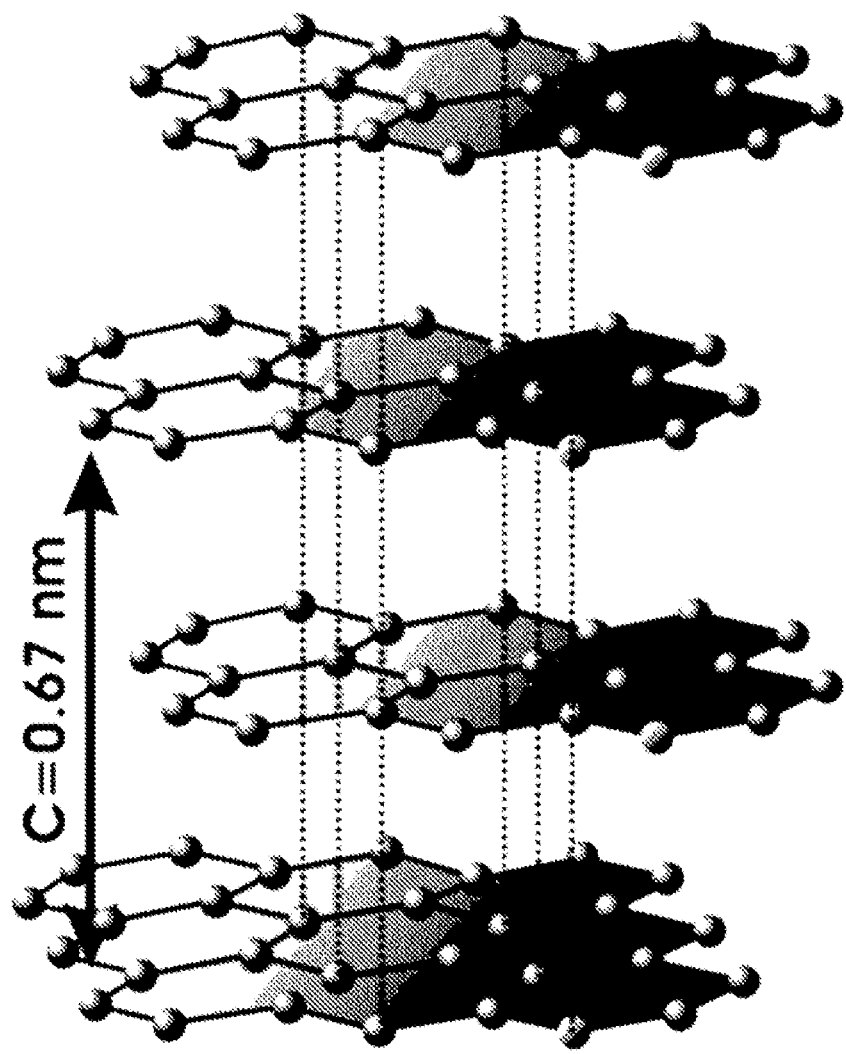
FIG. 6 shows an example of the crystal structure and c-axis value of graphite.

1: thermally conductive thin film
11: heat source
12: heat sink
13: casing
20: LED element
30: light guide plate
40: optical film
50: substrate
60: battery cell
110: cellular phone
111: battery
112: battery case
113: display unit
114: bracket
115: chipset substrate
120: open-type cellular phone case
130: folder-type cellular phone case
131: cover unit
132: housing unit
200: tablet PC
300: laptop PC
301: display unit
302: keyboard unit
400: handheld game console
500: MP3 player
600: external hard disc drive
700: set-top box
800: beam projector
900: car black box
950: EMI gasket
960: case
F: front side
B: rear side
U: top side
L: bottom side
S: lateral side

BEST MODE FOR CARRYING OUT THE INVENTION

Hereinafter, the present invention will be described in detail.

Process for Preparing a Thermally Conductive Thin Film

According to an embodiment of the present invention, there is provided a process for preparing a thermally conductive thin film, which comprises: (1) pretreating synthetic graphite powder under a pressurized or decompressed condition; (2) adding an intercalant to the pretreated synthetic graphite powder; (3) thermally treating the synthetic graphite powder to which the intercalant has been added; and (4) rolling the thermally treated synthetic graphite powder.

FIG. 1 illustrates an example of the process for preparing a thermally conductive thin film according to the present invention.

Referring to FIG. 1, according to an embodiment of the present invention, synthetic graphite powder are prepared (S100); the powder are screened based on the particle size (S200); they are subjected to a high-temperature, pressurized pretreatment or a high-temperature, decompressed pretreatment (S300); an intercalant is added to carry out intercalation (S400); they are thermally treated at a temperature of 1,500 to 2,200° C. to expand the synthetic graphite powder (S500); they are made to a thin film through a rolling step (S600); and a final thermally conductive thin film is obtained (S700).

Hereinafter, each step will be described in detail.

(1) Pretreatment Step

In the above step (1), synthetic graphite powder are pretreated under a pressurized or decompressed condition.

Synthetic graphite (or artificial graphite) is a material graphitized by artificially treating a graphitizable carbon material, which is distinguished from natural graphite obtained by collecting graphite present in the natural state.

Thus, the synthetic graphite powder used as a raw material of the thermally conductive thin film of the present invention is distinguished from natural graphite powder, which have been conventionally used in the preparation of a graphite thin film. That is, natural graphite powder such as crystalline flake graphite powder or amorphous graphite powder are not used in the present invention.

There are various kinds of synthetic graphite depending on the raw material and the preparation method. In general, it refers to graphitized cokes obtained by thermally treating cokes, which is a petroleum or coal by-product, at high temperatures. As described above, synthetic graphite is normally prepared through thermal treatment at 1,000 to 2,000° C. and additionally at 2,000 to 3,000° C. as needed. Thus, it is superior to natural graphite in terms of purity, crystallinity, electrical conductivity, thermal conductivity, and the like.

In addition, kish graphite, which is obtained by refining the graphite component alone from a mixture of graphite and slag separated upon the cooling of molten pig iron or cast iron, is also included in a wide range of synthetic graphite.

Synthetic graphite has a hexagonal crystal structure, has a molecular weight of about 12.0, and may have an appearance of a black powder. In addition, synthetic graphite may have a specific gravity of about 2.23 to 2.25, a melting point of about 3,500° C. or higher, a Mohs hardness of 1 to 2, and a specific heat of about 0.46 cal/g·° C. In addition, synthetic graphite may have a thermal conductivity of about 0.4 to 1.0 cal/cm·s·° C., a coefficient of thermal expansion of about $1.7 \times 10^{-6}$, an elastic modulus of about $3.5 \times 10^5$ kg/cm$^2$, an electrical resistance of about 0.04 to 0.08 •·cm, and a friction coefficient of about 0.1 to 0.2.

It is preferable to select spherical type, flake type, or plate type synthetic graphite powder having thermal conductivity as the synthetic graphite powder according to the present invention. Their manufacturers include Sungraf, Tennry Carbon, and Bai Xing Graphite.

FIG. 2 is an exemplary SEM image of synthetic graphite powder (before expansion). Since such synthetic graphite powder has voids, it is capable of expansion through intercalation.

The synthetic graphite powder used in the present invention are not particularly limited as long as they are expandable synthetic graphite powder.

As a preferred example, the synthetic graphite powder may be graphitized cokes powder, kish graphite powder, or mixed powder thereof.

Such synthetic graphite powder have conventionally been used mainly for the production of electrode rods in the field of steel, cathode materials for mobile phones, moderators for nuclear power, and the like.

Synthetic graphite powder vary in such physical properties as carbon content, interlayer space, density, and the like depending on the particle diameter.

Tables 1 and 2 below summarize various physical properties depending on the particle diameter of synthetic graphite powder.

TABLE 1

| Particle diameter (mesh) | Particle diameter (μm) | Carbon content (avg., % by mole) | Density (g/cm³) | Interlayer space (nm) | pH |
|---|---|---|---|---|---|
| 32 | 560 | 90 to 97% | 0.9 to 1.0 | 0.3358 ± 0.0003 | >5 |
| 50 | 300 | 90 to 96% | 0.9 to 1.0 | 0.3358 ± 0.0003 | >5 |
| 80 | 180 | 90 to 96% | 0.9 to 1.0 | 0.3358 ± 0.0003 | >5 |
| 100 | 150 | 90 to 99% | 0.9 to 1.0 | 0.3358 ± 0.0003 | >5 |
| 200 | 74 | 90 to 99% | 0.9 to 1.0 | 0.3358 ± 0.0003 | >5 |
| 325 | 45 | 80 to 95% | 0.9 to 1.0 | 0.3358 ± 0.0003 | >5 |
| 400 | 38 | 80 to 95% | 1.0 to 1.2 | 0.3358 ± 0.0003 | >5 |
| 500 | 28 | 80 to 95% | 1.0 to 1.2 | 0.3358 ± 0.0003 | >5 |
| 600 | 23 | 80 to 95% | 1.0 to 1.2 | 0.3358 ± 0.0003 | >5 |
| 1000 | 15 | 80 to 95% | 1.1 to 1.25 | 0.3358 ± 0.0003 | >5 |
| 1,500 | 10 | 80 to 99% | 1.1 to 1.3 | 0.3358 ± 0.0003 | >5 |
| 2100 | 6 | 80 to 99% | 1.1 to 1.3 | 0.3358 ± 0.0003 | >5 |
| 3000 | 5 | 80 to 99% | 1.1 to 1.35 | 0.3358 ± 0.0003 | >5 |

TABLE 2

| Avg. particle diameter (μm, D50) | Carbon content (avg., % by mole) | Tab density (avg., g/cm³) | pH |
|---|---|---|---|
| 3 to 20 | 90 to 99% | 1.1 to 1.3 | >5 |
| 20 to 50 | 90 to 99% | 1.0 to 1.2 | >5 |
| 50 to 100 | 90 to 99% | 1.0 to 1.2 | >5 |
| 100 to 500 | 90 to 99% | 1.0 to 1.2 | >5 |
| 500 to 1,000 | 90 to 99% | 0.9 to 1.1 | >5 |
| 1,000 to 2,000 | 90 to 99% | 0.9 to 1.0 | >5 |

As such, the synthetic graphite powder may have a particle diameter of 3 to 20 μm, 20 to 50 μm, 50 to 100 μm, 100 to 500 μm, 500 to 1,000 μm, or 1,000 to 2,000 μm.

Preferably, the synthetic graphite powder may have a particle diameter in the range of 50 to 500 μm, in the range of 50 to 200 μm, in the range of 100 to 200 μm, or in the range of 100 to 150 μm.

If the particle diameter of the synthetic graphite powder is within the above preferred range, there is an advantage that the intercalant is well inserted into the voids of the graphite powder, whereby they expand well.

Such synthetic graphite powder are pretreated under a pressurized or decompressed condition.

The thermal conductivities of the synthetic graphite powder and of the final thin film may be further enhanced through the pretreatment.

According to the theory of heat transfer, heat is transferred by the movement of free electrons and molecules, more specifically by lattice vibrations. Heat energy is transferred from high to low. In such event, large intermolecular space or gaps result in poor heat transfer. As shown in Equation 1 below, since the thermal conductivity is affected by the density, it is possible to further enhance the thermal conductivity of a final thin film through high densification to make the space between molecules narrow as much as possible.

$$\lambda = \rho \alpha C_p \quad \text{[Equation 1]}$$

In the above equation, $\lambda$ is thermal conductivity (W/m·K), $\rho$ is density (g/cm³), $C_p$ is specific heat (J/g·K), and $\alpha$ is thermal diffusivity (m²/s).

Such high densification of a final thin film can be achieved by pretreating the synthetic graphite powder as a raw material under a pressurized or decompressed condition.

As an example, the synthetic graphite powder may be pretreated under a pressurized condition of 100 to 2,000 bar. The synthetic graphite powder aggregate to be hard through such pretreatment under a pressurized condition, whereby high densification can be achieved.

As another example, the synthetic graphite powder may be pretreated under a decompressed condition of $10^{-2}$ to $10^{-7}$ Torr. In the microstructure of the synthetic graphite powder, the space for intercalation is increased through such pretreatment under a decompressed condition to enhance the degree of expansion, which makes it possible to obtain a thin film having an enhanced interlayer structure upon the subsequent rolling, thereby achieving high densification.

The pretreatment under a pressurized or decompressed condition may be carried out at room temperature or under a high temperature condition. For example, thermal treatment may be carried out at a temperature of 500 to 3,000° C., 500 to 2,500° C., 500 to 2,000° C., 1,500 to 2,600° C., or 1,000 to 3,000° C., at the time of the pretreatment. The carbon atoms are rearranged to further grow the graphite crystal structure through the pretreatment under such high temperature conditions as shown in the graphite crystal model (i.e., Marsh-Griffiths model), thereby enhancing the thermal conductivity. In addition, the degree of expansion and interparticle space of the synthetic graphite powder can be varied by adjusting the temperature conditions during the pretreatment under a decompressed condition (see Table 8).

As a preferred example, the pretreatment may be carried out as thermal treatment of the synthetic graphite powder at 500 to 3,000° C. under a pressurized condition of 100 to 2,000 bar.

As another preferred example, the pretreatment may be carried out as thermal treatment of the synthetic graphite powder at 500 to 3,000° C. under a decompressed condition of $10^{-2}$ to $10^{-5}$ Torr.

For such decompressed thermal treatment at a high temperature, a furnace that can reduce the pressure may be used. The type of furnace may be an induction heating furnace or a resistance heating furnace.

The pretreatment may be adjusted to 30 minutes to 50 hours, 30 minutes to 30 hours, or 30 minutes to 10 hours.

If necessary, the step of screening the synthetic graphite powder into the desired particle size range may be carried out in advance prior to the pretreatment.

The screening of the synthetic graphite powder depending on the particle diameter may be carried out using a mesh. For example, a grating mesh may be used.

For specific shapes of the mesh, with reference to FIG. 3, (i) a grating mesh having rectangular holes, (ii) a grating mesh having square holes and rectangle holes together, or (iii) a grating mesh having square holes may be used. In addition, one of these meshes or a combination thereof may be used.

According to an example, the screening of the synthetic graphite powder may sequentially comprise: (i) first screening with the grating mesh having rectangular holes; (ii) second screening with the grating mesh having rectangular holes and square holes together; and (iii) third screening with the grating mesh having square holes.

As the material of the mesh, steel, stainless steel (SUS), glass fiber reinforced plastic (FRP), or a combination thereof may be used. In particular, among these, an FRP material prepared by mixing an unsaturated polyester resin and fiberglass is preferable from the viewpoint of light weight, hardness, durability, and economic efficiency. In addition, the FRP material also has chemical resistance, insulation, and nonmagnetic properties, which is advantageous for graphite treatment.

(2) Intercalation Step

In the above step (2), an intercalant is added to the pretreated synthetic graphite powder.

An oxidizing agent may be used as the intercalant.

For example, a strong oxidizing agent selected from the group consisting of sulfuric acid, nitric acid, potassium chlorate, potassium nitrate, and a mixture thereof may be used as a first oxidizing agent. As a preferred example, sulfuric acid, nitric acid, a mixture of sulfuric acid and nitric acid, a mixture of nitric acid and potassium chlorate, or a mixture of sulfuric acid and potassium nitrate may be used as the first oxidizing agent.

However, if the first oxidizing agent is used alone, intercalation may be difficult because there may exist ions strongly bound to water molecules such as $SO_3$ of sulfuric acid.

Thus, it is preferable that a compound selected from the group consisting of perchloric acid, hydrogen peroxide, chromic acid, boric acid, and a mixture thereof is further used as a second oxidizing agent (or supplement oxidizing agent) in the treatment with the first oxidizing agent.

In such event, the first oxidizing agent and the second oxidizing agent may be used at a concentration of 5 to 60%, respectively. For example, they may be used at a concentration in the range of 10 to 60%, in the range of 20 to 60%, in the range of 30 to 60%, or in the 40 to 60%, respectively.

The mixing weight ratio of the first oxidizing agent and the second oxidizing agent may be 1:100 to 50:100, more specifically 1:100 to 20:100, even more specifically 1:100 to 10:100.

As a preferred example, the intercalant may comprise a first oxidizing agent selected from the group consisting of sulfuric acid, nitric acid, potassium chlorate, potassium nitrate, and a mixture thereof at a concentration of 40 to 60%. In addition, in such event, the intercalant may further comprise a second oxidizing agent selected from the group consisting of perchloric acid, hydrogen peroxide, chromic acid, boric acid, and a mixture thereof. The first oxidizing agent and the second oxidizing agent may be comprised at a weight ratio of 1:100 to 50:100.

(3) Thermal Treatment Step

In the above step (3), the synthetic graphite powder to which the intercalant has been added are thermally treated.

The synthetic graphite powder may be expanded through the thermal treatment.

The thermal treatment may be carried out at a temperature of about 1,000 to 3,000° C. More specifically, it may be carried out at a temperature of 1,000 to 2,500° C., 1,500 to 3,000° C., 1,500 to 2,500° C., 1,200 to 2,200° C., 1,500 to 2,200° C., or 1,000 to 2,200° C.

In contrast, in the preparation of conventional natural graphite powder, the expansion is generally carried out at a temperature in the range of 700 to 800° C. It is possible in the present invention to further enhance the thermal conductivity by carrying out the thermal treatment in the above preferred temperature range.

The synthetic graphite powder thus thermally treated may have a degree of expansion of 120 to 500%, specifically 120 to 195%, 130 to 170%, or 150 to 300%.

Here, the degree of expansion may be defined as a percentage of the c-axis value after expansion with reference to the c-axis value before expansion in the graphite crystal structure.

In the general crystal structure of graphite, as shown in FIG. 6, rings consisting of six carbons are connected to form a layer in which the c-axis value (twice the interlayer space) is about 6.67 Å, and the bond length between carbons is about 1.42 Å. In addition, the unit lattice of graphite contains four carbon atoms, and the lattice constant is about 2.456 Å.

The graphite thus expanded may be mixed with a binder resin (or adhesive) added for the aggregation of the expanded graphite before rolling. The addition of a binder resin may be determined according to the thickness of the desired graphite thin film. It may be used for the production of a high-density thin film even in the same thickness. If a binder resin is added, the reduction ratio can be higher in the subsequent rolling step, whereby a thin film having an enhanced thermal conductivity can be obtained.

A conventional adhesive resin may be used as the binder resin. Specific examples thereof may include cellulose-based resins, epoxy-based resins, acrylic-based resins (e.g., methyl methacrylate, alkyl acrylate polymers), phenolic-based resins (e.g., resol, novolac, resorcinol formaldehyde, xylene, furan, polyvinyl acetate, polyvinyl alcohol, polyvinyl formal, polyvinyl butyral, nitrile rubber, chloroprene, nylon, and the like), urethane-based resins (e.g., polyamide, polyester, polyurethane, and the like), amino-based resins, melamine-based resins, acetic acid-based resins, and polyisocyanate-based resins.

The binder resin may further comprise a UV curable resin to achieve the readiness of curing and the improvement in the tensile strength at the time of preparing a plate type thin film. Urethane acrylate-based resins may be used as the UV curable resin. The UV curable resin may be added so as to be contained in the final plate type product in an amount of less than 1% by weight. Even with such a small amount, it is possible to secure the tensile strength of the plate type product and the readiness of preparation thereof.

The graphite to which the UV curable resin has been added may be further subjected to a UV curing step. For example, the UV curing may be carried out at a wavelength in the range of 315 nm to 400 nm, more specifically at a wavelength in the range of 350 to 380 nm. An arc discharge lamp may be used as the UV lamp. For example, a gallium lamp, a mercury lamp, a metal lamp, or the like may be used. It may be more advantageous to use a gallium lamp for curing among them in light of the properties of a graphite thin film.

(4) Rolling Step

In the above step (4), the thermally treated synthetic graphite powder are rolled.

The rolling may be carried out by, for example, passing through a press roller 1 to 5 times for pressing. The pressing condition and the number of repetitions of the rolling may be determined in view of the desired thickness of a thin film. The rolling may adjust the thickness of the thin film and enhance the density, thermal conductivity, and tensile strength thereof.

The thin film thus obtained can be used as a thermally conductive thin film as it is.

Alternatively, the thermally conductive thin film may be combined with other functional layers to form a composite sheet. For example, the thermally conductive thin film may be combined with an adhesive layer to impart an adhesive property.

In such event, the adhesive layer may comprise a thermally conductive filler to further enhance the thermal conductivity. For example, the adhesive layer may comprise a carbon-based filler, a metal-based filler, or a composite filler thereof.

Specifically, the adhesive layer may comprise a composite filler comprising a carbon-based filler and a metal-based filler; a binder resin; and an adhesive.

As an example, in the above step (4), the thermally treated synthetic graphite powder may be coated on at least one side of the adhesive layer and rolled to obtain a thermally conductive thin film combined with the adhesive layer.

In particular, if the synthetic graphite powder expanded through the thermal treatment is applied to both sides of the adhesive layer and then rolled, it is possible to easily prepare a thermally conductive thin film having excellent tensile strength and flexibility while having a high filling ratio of the thermal conductive filler. In addition, in such event, as a solid powdery filler is applied on both sides of the adhesive layer and then rolled, part of the adhesive component of the adhesive layer may penetrate into the filler layer, thereby producing a side effect of enhancing the interlayer bonding force.

As another example, the step of laminating the thermally conductive thin film on at least one side of the adhesive layer may be further carried out subsequent to the above step (4).

As a preferred example of the process for preparing a thermally conductive thin film as described above, the synthetic graphite powder in step (1) have a particle diameter of 50 to 200 µm; the pretreatment is carried out as thermal treatment of the synthetic graphite powder at 500 to 3,000° C. under a decompressed condition of $10^{-2}$ to $10^{-5}$ Torr; the intercalant comprises a first oxidizing agent selected from the group consisting of sulfuric acid, nitric acid, potassium chlorate, potassium nitrate, and a mixture thereof at a concentration of 40 to 60%; the thermal treatment in step (3) is carried out at a temperature of 1,500 to 3,000° C.; and the thermally conductive thin film may have a thickness of 50 to 1,000 µm, a density of 1.5 to 2.0 g/cm³, and a horizontal thermal conductivity in the range of 300 to 700 W/m·K.

Thermally Conductive Thin Film

According to another embodiment of the present invention, there is provided a thermally conductive thin film prepared by the above process.

That is, the thermally conductive thin film is one obtained by rolling expanded synthetic graphite powder.

Specifically, the thermally conductive thin film is one obtained by adding an intercalant to synthetic graphite powder to intercalate them, thermally expanding them, and rolling them.

FIG. 4 is an SEM image of a cross-section of a thermally conductive thin film prepared according to the example of the present invention.

The thermally conductive thin film according to the present invention is excellent in thickness, density, and thermal conductivity.

For example, the thermally conductive thin film may have a thickness of 20 to 3,000 µm, more specifically a thickness in the range of 30 to 2,000 µm or in the range of 50 to 1,000 µm.

In addition, the thermally conductive thin film may have a density of 1.0 to 2.5 g/cm³, more specifically a density in the range of 1.3 to 2.2 g/cm³ or in the range of 1.5 to 2.0 g/cm³.

In addition, the thermally conductive thin film may have a thermal conductivity in the horizontal direction of 200 to 1,000 W/m·K, more specifically a thermal conductivity in the range of 300 to 900 W/m·K, in the range of 300 to 800 W/m·K, or in the range of 300 to 700 W/m·K.

As a preferred example, the thermally conductive thin film may have a thickness of 50 to 1,000 µm, a density of 1.5 to 2.0 g/cm³, and a thermal conductivity in the horizontal direction of 300 to 700 W/m·K.

The thermally conductive thin film may be further provided with one or more functional layers on at least one side thereof.

For example, the thermally conductive thin film may be further provided with an adhesive layer.

In such event, the adhesive layer may comprise a thermally conductive filler. For example, the adhesive layer may comprise a carbon-based filler, a metal-based filler, or a composite filler thereof.

As a specific example, the thermally conductive thin film may be further provided with an adhesive layer on at least one side thereof.

As another specific example, the thermally conductive thin film may be further provided with an adhesive layer on both sides thereof. The adhesive layer may comprise a carbon-based filler, a metal-based filler, or a composite filler thereof.

The thermally conductive thin film provided with the adhesive layer as described above may be excellent in tensile strength. For example, the thermally conductive thin film provided with the adhesive layer may have a tensile strength of 20 to 50 kg/mm².

In addition, if the thermally conductive thin film is provided with the adhesive layer on both sides thereof and the adhesive layer comprises a thermally conductive filler as described in the above example, the filler filling ratio may be further enhanced.

Articles and a Method of Heat Dissipation

According to still another embodiment of the present invention, there is provided an article provided with the thermally conductive thin film therein.

The article to which the present invention is applied may be an electronic device, an electronic device case, a lighting device, a battery, a battery case, or an EMI gasket.

The electronic device may be a cellular phone, a desktop PC, a laptop PC, a tablet PC, a virtual reality (VR) device, a set-top box, a handheld game console, an external hard disk drive, an MP3 player, a beam projector, a television, a monitor, a car black box, a car navigator, a communication device, a power converter, a power supplier, or a medical electronic device.

In addition, the lighting device may be an LED lighting device or a light bulb.

Preferably, the article may have a heat source that generates heat by an electrical, electronic, or chemical action. For example, the electronic device may comprise an electronic element, a circuit board, or a light source.

The thermally conductive thin film may be attached directly to the surface of the heat source, to the surface of a heat sink in close contact with the heat source, or to a casing of the article adjacent to the heat source.

As a preferred example, the article is an electronic device, a lighting device, or a battery comprising a heat source, and the thermally conductive thin film may be attached directly to the surface of the heat source, to the surface of a heat sink in close contact with the heat source, or to a casing of the article adjacent to the heat source.

FIGS. 7a to 12 show examples in which the thermally conductive thin film is employed in various articles. Specifically, FIG. 7a illustrates an exploded view of a cellular phone to which the thermally conductive thin film is applied; FIGS. 7b to 7d illustrate cross-sectional views of an electronic device to which the thermally conductive thin film is applied; FIGS. 8a and 8b illustrate plan views of direct-type and edge-type flat panel lighting devices to which the thermally conductive thin film is applied, respectively; FIGS. 9a and 9b illustrate cross-sectional views of direct-type and edge-type flat panel lighting devices to which the thermally conductive thin film is applied, respectively; FIG. 10 illustrates a bulb-type lamp to which the thermally conductive thin film is applied; FIG. 11 illustrates a cross-sectional view of an LED lighting device to which the thermally conductive thin film is applied; and FIG. 12 illustrates a perspective view of an electric vehicle to which the thermally conductive thin film is applied and an enlarged view of the battery cell mounted therein.

As depicted in FIG. 7a, the thermally conductive thin film (1) may be disposed adjacent to a display unit (113) or a chipset substrate (115) of a cellular phone.

In addition, as depicted in FIGS. 7b to 7d, the thermally conductive thin film (1) may be attached to a casing (13) in the area corresponding to a heat source (11) of an electronic device (see FIG. 7b), to the surface of a heat sink (12) in close contact with the heat source (11) (see FIG. 7c), or directly to the surface of the heat source (11) (see FIG. 7d).

In addition, as depicted in FIGS. 8a and 9a, the thermally conductive thin film (1) may be attached to the rear surface of an LED element (20) of a direct-type flat panel lighting device, or to the rear surface of a heat sink (12) in close contact with the LED element. As depicted in FIGS. 8b and 9b, the thermally conductive thin sheet (1) may be attached to a position adjacent to the edge of an edge-type flat panel lighting device where an LED element (20) is provided, that is, the side of the casing.

In addition, as depicted in FIG. 10, the thermally conductive thin film may be attached to the inner wall of a casing (13) of a bulb type lamp.

In addition, FIG. 11 illustrates a cross-sectional view of a typical LED lighting device. The thermally conductive thin film (1) may be attached to one side of a substrate (50) provided with an LED element (20) and to one side of a heat sink (12).

In addition, the thermally conductive thin film (1) may be attached to the surface of a battery cell (60) mounted in an electric vehicle, as depicted in FIG. 12, in order to protect the battery cell from high temperatures.

FIGS. 13a to 15e illustrate examples in more detail in which the thermally conductive thin film is applied to various articles.

As depicted in FIG. 13a, the thermally conductive thin film (1) may be attached to the front side (F) or the rear side (B) of a battery (111), which is one of the components that generate heat the most in a cellular phone (110); or to the front side (F) or the rear side (B) of a battery cover (112) of the cellular phone (110), thereby producing the effect of heat dissipation.

In addition, as depicted in FIG. 13b, the thermally conductive thin film (1) may be attached to a cellular phone case in addition to the cellular phone body to dissipate heat from the cellular phone. For example, the thermally conductive thin film (1) may be attached to the front side (F) or the rear side (B) of an open-type cellular phone case (120); to the front side (F) or the rear side (B) of a cover unit (131) of a folder-type cellular phone case (130); or to the front side (F) or the rear side (B) of a housing unit (132) for accommodating a cellular phone (110) in the folder-type cellular phone case (130), thereby producing the effect of dissipating heat.

The open-type cellular phone case (120) and the folder-type cellular phone case (130) may comprise a material selected from the group consisting of a polymer resin, natural leather, synthetic leather, metal, rubber, cubic zirconia, and a combination thereof.

In addition, the thermally conductive thin film (1) may be applied to a mobile device other than a cellular phone. For example, it may be attached to the rear side (B) of a tablet PC (200) (see FIG. 14a); to the rear side (B) of a display unit (301) of a laptop PC (300) or the front or rear side of a keyboard unit (302) (see FIG. 14b); to the rear side (B) of a handheld game console (400) (see FIG. 14c); or to the rear side (B) of an MP3 player (500) (see FIG. 14d), thereby producing the effect of dissipating heat.

In addition, the thermally conductive thin film (1) may be applied to other various electronic devices than those exemplified above and may be attached to the front side (F) or the rear side (B) of an external hard disk drive (600) (see FIG. 15a); to the top side (U), the bottom side (L), or the lateral side (S) of a set-top box (700) (see FIG. 15b); to the top side (U) or the bottom side (L) of a beam projector (800) (see FIG. 15c); or to the front side (F) or the rear side (B) of a car black box (900) (see FIG. 15d), thereby producing the effect of dissipating heat.

In addition, the thermally conductive thin film (1) may be applied to an article for suppressing electromagnetic interference (EMI). For example, it may be attached to the surface of an EMI gasket (950), which is then installed in a case (960) (see FIG. 15e).

Mode for the Invention

Hereinafter, the present invention will be described in more detail with reference to the following examples. However, the scope of the present invention is not limited to the examples only.

Example 1

Preparation of a Thermally Conductive Thin Film 1.1. Screening of Synthetic Graphite Powder Synthetic graphite powder in a spherical shape (Sungraf Co., Ltd.) were first screened for powder having a particle diameter of 50 to 500 μm using a mesh, which were second screened for powder having a particle diameter of 100 to 300 μm. The average particle diameter of the synthetic graphite powder finally screened was 100 to 200 μm.

1.2. Pretreatment

The screened synthetic graphite powder were pretreated under a decompressed condition. Specifically, the synthetic graphite powder were put in a decompression chamber (high-temperature vacuum hydrogen reduction furnace, HT-VH-RF-2000, Polynanotech Co., Ltd.) and thermally treated at about 2,000° C. under a decompressed condition of about $10^{-2}$ Torr.

1.3. Addition of an Intercalant

The pretreated synthetic graphite powder were charged to the input of the reactor, which were then treated by addition of an intercalant. Specifically, sulfuric acid ($H_2SO_4$), a strong oxidizing agent, at a concentration of 50% as a first oxidizing agent was added to the reactor, and perchloric acid, a supplement oxidizing agent, at a concentration of 50% as a second oxidizing agent was further added. In such event, the weight ratio of the first oxidizing agent and the second oxidizing agent was 60:40. Thereafter, they were mixed in the reactor, followed by washing and drying thereof.

1.4. Thermal Treatment

The reactor in which the synthetic graphite powder treated with the intercalant were disposed was heated to 1,500° C. to thermally treat the synthetic graphite powder, thereby expanding them.

1.5. Rolling

The expanded graphite was collected and molded to a plate shape to adjust the thickness, followed by rolling thereof 3 to 5 times using a pressure roller, thereby preparing a thin film. The thin film thus obtained was wound up in a roll form while its length was adjusted.

Test Example 1

Evaluation of Density Change with Respect to Pressurization Pretreatment

The procedure was carried out according to Example 1, except that the pretreatment was carried out under a pressurized condition, instead of the decompressed condition, in step 1.2 to evaluate the density of the final thin film.

In such event, the synthetic graphite powder were put in a pressurization chamber (equiaxed pressurizer, KCIP 120, Korea Vacuum) and thermally treated at 500 to 2,000° C. under a pressurized condition of 100 to 2,000 bar as shown in Table 3 below.

The density of the thin film finally obtained through the pressurization pretreatment was measured and shown in Table 3 below.

In addition, the density of a thin film not subjected to the pressure pretreatment under the same conditions was also shown as a comparative example.

TABLE 3

| | Density of final thin film (g/cm$^3$) | | | | Thickness |
|---|---|---|---|---|---|
| Pressurized condition | Pressurization pretreatment not carried out | Pressurization pretreatment carried out | Density Increase (%) | Temp (° C.) | of thin film (μm) |
| 100 bar | 1.11 | 1.13 | 1.8 | 1,500 | 200 |
| 500 bar | 1.11 | 1.18 | 6.3 | 1,500 | 200 |
| 1,000 bar | 1.11 | 1.19 | 7.2 | 1,500 | 200 |
| 2,000 bar | 1.11 | 1.19 | 7.2 | 1,500 | 200 |

As shown in Table 3 above, the case where the pressurization pretreatment was carried out is superior to the case where the pressurization pretreatment was not carried out in terms of the density of the final thin film.

Test Example 2

Evaluation of Density Change with Respect to Decompression Pretreatment

The procedure was carried out according to Example 1, except that the pretreatment was carried out under various decompressed conditions in step 1.2 to evaluate the density of the final thin film.

In such event, the synthetic graphite powder were put in a decompression chamber (high-temperature vacuum hydrogen reduction furnace, HT-VH-RF-2000, Polynanotech Co., Ltd.) and thermally treated at 500 to 2,000° C. under a pressure condition of $10^{-1}$ to $10^{-5}$ Torr.

The density of the thin film finally obtained through the decompression pretreatment was measured and shown in Tables 4 to 7 below. In addition, the density of a thin film not subjected to the decompression pretreatment under the same conditions was also shown as a comparative example.

TABLE 4

| Temp. condition | Decompressed condition (Torr) | Density of final thin film (g/cm$^3$) | | Density Increase (%) | Thickness of thin film (μm) |
|---|---|---|---|---|---|
| | | Decompression pretreatment not carried out | Decompression pretreatment carried out | | |
| 500° C. | $10^{-1}$ | 1.11 | 1.2 | 8.1 | 200 |
| | $10^{-2}$ | 1.11 | 1.23 | 10.8 | 200 |
| | $10^{-3}$ | 1.11 | 1.29 | 16.2 | 200 |
| | $10^{-4}$ | 1.11 | 1.34 | 20.7 | 200 |
| | $10^{-5}$ | 1.11 | 1.37 | 23.4 | 200 |

TABLE 5

| Temp. condition | Decompressed condition (Torr) | Density of final thin film (g/cm$^3$) | | Density Increase (%) | Thickness of thin film (μm) |
|---|---|---|---|---|---|
| | | Decompression pretreatment not carried out | Decompression pretreatment carried out | | |
| 1,000° C. | $10^{-1}$ | 1.01 | 1.13 | 11.9 | 500 |
| | $10^{-2}$ | 1.01 | 1.19 | 17.8 | 500 |
| | $10^{-3}$ | 1.01 | 1.24 | 22.8 | 500 |
| | $10^{-4}$ | 1.01 | 1.3 | 28.7 | 500 |
| | $10^{-5}$ | 1.01 | 1.38 | 36.6 | 500 |

TABLE 6

| Temp. condition | Decompressed condition (Torr) | Density of final thin film (g/cm$^3$) | | Density Increase (%) | Thickness of thin film (μm) |
|---|---|---|---|---|---|
| | | Decompression pretreatment not carried out | Decompression pretreatment carried out | | |
| 1,500° C. | $10^{-1}$ | 1.0 | 1.28 | 28.0 | 750 |
| | $10^{-2}$ | 1.0 | 1.33 | 33.0 | 750 |
| | $10^{-3}$ | 1.0 | 1.39 | 39.0 | 750 |
| | $10^{-4}$ | 1.0 | 1.47 | 47.0 | 750 |
| | $10^{-5}$ | 1.0 | 1.52 | 52.0 | 750 |

TABLE 7

| Temp. condition | Decompressed condition (Torr) | Density of final thin film (g/cm$^3$) | | Density Increase (%) | Thickness of thin film (μm) |
|---|---|---|---|---|---|
| | | Decompression pretreatment not carried out | Decompression pretreatment carried out | | |
| 1,500° C. | $10^{-1}$ | 0.98 | 1.26 | 28.6 | 900 |
| | $10^{-2}$ | 0.98 | 1.33 | 35.7 | 900 |
| | $10^{-3}$ | 0.98 | 1.44 | 46.9 | 900 |
| | $10^{-4}$ | 0.98 | 1.53 | 56.1 | 900 |
| | $10^{-5}$ | 0.98 | 1.68 | 71.4 | 900 |

As shown in Tables 4 to 7 above, the case where the compression pretreatment was carried out is superior to the case where the compression pretreatment was not carried out in terms of the density of the final thin film. The density of the thin film was increased by up to 70% or more according to the temperature and the decompression conditions.

In addition, the cross-section of the thermally conductive thin films finally obtained with and without the pretreatment was observed with an electron microscope and shown in FIGS. 4 and 5, respectively.

As a result, the thin film prepared by the pretreatment (FIG. 4) had almost no voids, and the reduction ratio was higher than that of the thin film prepared without the pretreatment (FIG. 5).

Test Example 3

Evaluation of Expansion Degree with Respect to Decompression Pretreatment and Pretreatment Temperature The procedure was carried out according to Example 1 using synthetic graphite powder (particle diameter of 50 to 200 μm), except that the decompression pretreatment prior to the expansion in step 1.3 was, or was not, carried out and that the pretreatment temperature was changed for evaluation. Thereafter, the degree of expansion of the synthetic graphite powder was calculated according to the following Equation 2 and summarized in Table 8 below.

Degree of expansion of synthetic graphite powder (%)=($c$-axis value after expansion/$c$-axis value before expansion in the graphite crystal structure)×100    [Equation 2]

TABLE 8

| No | Pretreatment before expansion | Decompressed condition | Heating condition | Degree of expansion of synthetic graphite powder |
|---|---|---|---|---|
| 1 | X | — | 500° C. | 105% |
| 2 | X | — | 1,000° C. | 105 to 110% |
| 3 | X | — | 1,500° C. | 110% |
| 4 | O | $10^{-2}$ Torr | 500° C. | 120 to 130% |
| 5 | O | $10^{-2}$ Torr | 1,000° C. | 130 to 150% |
| 6 | O | $10^{-2}$ Torr | 1,500° C. | 150 to 300% |

As shown in Table 8 above, the degree of expansion of synthetic graphite powder was enhanced when the decompression pretreatment was carried out before expansion. The degree of expansion was also enhanced with the pretreatment temperature.

Test Example 4

Evaluation with Respect to the Concentration of Intercalant

The procedure was carried out according to Example 1, except that the concentration of the intercalant used in step 1.3 was changed for evaluation.

Specifically, the concentration of the intercalant was changed to 20 to 50% for expansion, followed by observation with a scanning electron microscope (SEM). The degree of expansion of the synthetic graphite powder was calculated according to Equation 2 and summarized in Table 9 below.

TABLE 9

| No | Concentration of first oxidizing agent | Degree of expansion of synthetic graphite powder |
|---|---|---|
| 1 | 20% | 120% |
| 2 | 30% | 150% |
| 3 | 50% | 190% |

As shown in Table 9 above, the expansion of the synthetic graphite powder was well performed when the intercalant concentration was 50%.

Test Example 5

Evaluation with Respect to the Expansion Temperature

The procedure was carried out according to Example 1, except that the temperature and pressure conditions for the thermal treatment in step 1.3 were changed for evaluation.

Specifically, it was carried out under the various temperature and pressure conditions as shown in Table 10 below, followed by observation of the synthetic graphite powder with SEM. The results are summarized.

TABLE 10

| No | Temp. of thermal treatment | Results of observation of the expanded synthetic graphite powder |
|---|---|---|
| 1 | 800° C. | Crystal structure not developed |
| 2 | 1,200° C. | Crystal structure not developed |
| 3 | 1,500° C. | Crystal structure developed |
| 4 | 1,800° C. | Crystal structure developed |
| 5 | 2,100° C. | Crystal structure developed |

As shown in Table 10 above, when the temperature of thermal treatment for the expansion of the synthetic graphite powder was 1,500 to 2,200° C., impurities were sufficiently removed, whereby the crystal structure was excellent.

In contrast, when the temperature of thermal treatment was 800 to 1,500° C., it was observed that the space was narrow, and the crystal structure was not well developed.

Test Example 6

Measurement of Thermal Conductivity and Density

Thermally conductive thin films of various thicknesses were prepared according to the procedure of Example 1, and the thermal conductivity and the density thereof were measured and summarized in Table 11 below. In such event, the thermal conductivity was measured as horizontal thermal conductivity according to the laser flash analysis (LFA) method.

In addition, the thermal conductivity and the density of a conventional natural graphite thin film sold on the market as a comparative example were measured and shown together.

TABLE 11

| Type | Thickness of thin film (mm) | Density (g/cm$^3$) | Thermal conductivity (W/m · K) | Thermal diffusivity (mm$^2$/s) |
|---|---|---|---|---|
| Ex. 1 | 0.065 | 1.74 | 402.850 | 297.207 |
| Ex. 1 | 0.173 | 1.798 | 453.656 | 313.041 |

TABLE 11-continued

| Type | Thickness of thin film (mm) | Density (g/cm³) | Thermal conductivity (W/m · K) | Thermal diffusivity (mm²/s) |
|---|---|---|---|---|
| Ex. 1 | 0.037 | 1.937 | 397.287 | 284.867 |
| Ex. 1 | 0.068 | 1.898 | 409.256 | 303.270 |
| Ex. 1 | 0.051 | 2.519 | 535.625 | 301.181 |
| Natural graphite thin film A | 0.12 | 1.412 | 241.297 | 219.936 |
| Natural graphite thin film B | 0.21 | 1.47 | 250.099 | 170.18 |

As shown in Table 11 above, the thermally conductive thin film of the examples prepared from the synthetic graphite powder according to the present invention has significantly enhanced thermal conductivity and thermal diffusivity as compared with the conventional natural graphite thin films.

The invention claimed is:

1. A process for preparing a thermally conductive thin film, which comprises:
   (1) pretreating synthetic graphite powder under a pressurized or decompressed condition wherein the pretreatment is conducted as thermal treatment of the synthetic graphite powder at 500 to 3,000° C. under a pressurized condition of 100 to 2,000 bar or as thermal treatment of the synthetic graphite powder at 500 to 3,000° C. under a decompressed condition of $10^{-2}$ to $10^{-5}$ Torr;
   (2) adding an intercalant to the pretreated synthetic graphite powder obtained in step (1);
   (3) thermally treating the synthetic graphite powder to which the intercalant has been added; and
   (4) rolling the thermally treated synthetic graphite powder obtained in step (3) to produce the thermally conductive thin film.

2. The process for preparing a thermally conductive thin film of claim 1, wherein the synthetic graphite powder in step (1) are graphitized cokes powder, kish graphite powder, or mixed powder thereof.

3. The process for preparing a thermally conductive thin film of claim 1, wherein the synthetic graphite powder in step (1) have a particle diameter of 50 to 200 μm.

4. The process for preparing a thermally conductive thin film of claim 1, wherein the intercalant in step (2) comprises a first oxidizing agent selected from the group consisting of sulfuric acid, nitric acid, potassium chlorate, potassium nitrate, and a mixture thereof at a concentration of 40 to 60%.

5. The process for preparing a thermally conductive thin film of claim 4, wherein the intercalant in step (2) further comprises a second oxidizing agent selected from the group consisting of perchloric acid, hydrogen peroxide, chromic acid, boric acid, and a mixture thereof, and the first oxidizing agent and the second oxidizing agent are comprised at a weight ratio of 1:100 to 50:100.

6. The process for preparing a thermally conductive thin film of claim 1, wherein the thermal treatment of step (3) is carried out at a temperature of about 1,500 to 3,000° C.

7. The process for preparing a thermally conductive thin film of claim 1, wherein the synthetic graphite powder thermally treated have a degree of expansion of 150 to 300%, and the degree of expansion is defined as a percentage of the c-axis value after expansion with reference to the c-axis value before expansion in the graphite crystal structure.

8. The process for preparing a thermally conductive thin film of claim 1, wherein the synthetic graphite powder in step (1) have a particle diameter of 50 to 200 μm;

the pretreatment of step (1) is carried out as the thermal treatment of the synthetic graphite powder at 500 to 3,000° C. under a decompressed condition of $10^{-2}$ to $10^{-5}$ Torr;

the intercalant in step (2) comprises a first oxidizing agent selected from the group consisting of sulfuric acid, nitric acid, potassium chlorate, potassium nitrate, and a mixture thereof at a concentration of 40 to 60%;

the thermal treatment of step (3) is carried out at a temperature of about 1,500 to 3,000° C.; and the thermally conductive thin film has a thickness of 50 to 1,000 μm, a density of 1.5 to 2.0 g/cm³, and a thermal conductivity in the horizontal direction of 300 to 700 W/mK.

* * * * *